United States Patent [19]

Beaver

[11] 3,913,195

[45] Oct. 21, 1975

[54] METHOD OF MAKING PIEZOELECTRIC DEVICES

[76] Inventor: William D. Beaver, 25951 Serenata Drive, Mission Viejo, Calif. 94590

[22] Filed: May 28, 1974

[21] Appl. No.: 473,667

[52] U.S. Cl. .................. 29/25.35; 29/418; 29/593; 29/628; 174/52 S; 174/DIG. 3; 310/8.9; 310/9.4

[51] Int. Cl.[2] .......................................... H01L 41/22

[58] Field of Search .......... 29/25.35, 628, 418, 593; 174/52 S, DIG. 3; 310/8.9, 9.1, 9.4

[56] References Cited

UNITED STATES PATENTS

| | | | |
|---|---|---|---|
| 3,317,287 | 5/1967 | Caracciolo | 174/DIG. 3 |
| 3,482,419 | 12/1969 | Rogers et al. | 174/DIG. 3 |
| 3,529,073 | 9/1970 | Leonard | 174/DIG. 3 |
| 3,766,616 | 10/1973 | Standte | 29/25.35 |
| 3,808,752 | 5/1974 | Beaver et al. | 29/25.35 |

*Primary Examiner*—Carl E. Hall
*Attorney, Agent, or Firm*—Gordon L. Peterson

[57] ABSTRACT

A method of making piezoelectric devices including providing a carrier-body section assembly including a carrier and a plurality of body sections attached to the carrier with each of the body sections including a set of terminals, attaching piezoelectric elements to each of the body sections with the set of terminals of each of the body sections being electrically coupled to the associated piezoelectric element, and removing the body sections with the attached piezoelectric elements from the carrier.

16 Claims, 19 Drawing Figures

METHOD OF MAKING PIEZOELECTRIC DEVICES

BACKGROUND OF THE INVENTION

As used herein, piezoelectric device means any device which includes a piezoelectric element mounted on a body or mounting structure. Piezoelectric resonators and monolithic crystal filters, i.e., acoustically coupled piezoelectric resonators are examples of piezoelectric devices.

The piezoelectric element of a piezoelectric device includes a crystal blank of piezoelectric material such as quartz having electrodes suitably affixed to the crystal blank. The piezoelectric element is mounted on the body in spaced relationship thereto in various ways such as by lead wires.

Piezoelectric devices are receiving increasing commercial acceptance, and as this occurs, the production techniques used in their manufacture become increasingly important. Production techniques for piezoelectric devices used heretofore are rather primitive and include substantial manual handling of individual resonators and resonator components. This drastically reduces production and significantly increases the cost of production.

SUMMARY OF THE INVENTION

The present invention substantially increases production and greatly reduces production costs by providing a method which permits batch production of piezoelectric devices. Manual handling of individual piezoelectric devices and components thereof is drastically reduced, and this reduces labor cost and increases the production rate.

One reason for the improvements noted above is that the present invention provides a carrier for carrying the piezoelectric devices through the work stations at which production operations are carried out. Thus, it is the carrier and the associated large number of piezoelectric devices rather than an individual piezoelectric device which are moved from station to station. This eliminates the loading and unloading of individual parts into processing equipment.

The carrier may be formed, at least in part, by elongated, conductive, carrier strips. A plurality of body sections are positioned between and attached to the carrier strips to form a carrier-body section assembly. Each of the body sections may include portions of the conductive carrier strips. Thus, in addition to providing a carrier function, the carrier strips may also form conductive portions of the body section including terminals thereby eliminating the need for separate conductors and terminals.

Although the method of this invention can be used to make many different kinds of piezoelectric devices, it is particularly adapted for making the planar-mounted type of resonators and monolithic crystal filters. In one such construction, the body section includes a peripheral wall adapted to circumscribe an associated piezoelectric element. Portions of the carrier strips are embedded in, and form portions of, the peripheral wall.

One important step in the manufacture of piezoelectric devices is the mounting of the piezoelectric element on the body section. One way to accomplish this is to position the carrier-body section assembly relative to a fixture for positioning the piezoelectric elements. Thus, in one positioning step a large number of the body sections can be properly positioned relative to an associated piezoelectric element. Assuming that lead wires are provided on each of the piezoelectric elements, the lead wires are then attached to the terminals on an associated body section to mechanically mount and electrically couple each of the piezoelectric elements to an associated body section.

It is important that the lead wires be properly sized and shaped so as to have an accurately predeterminable effect on the resonant characteristics of the piezoelectric device. Lead wire preparation involves several process steps including, for example, pre-tinning and attaching the leads to the piezoelectric element and appropriately bending the leads. One advantage of the present invention is that the leads may be formed integrally with the carrier strips. With this construction the mounting step includes attaching, as by soldering, these integral leads to the piezoelectric element. By so doing, the numerous lead wire processing steps utilized heretofore can be eliminated.

Another important step in the production of resonators is adjusting the frequency of the resonator. For some resonators and monolithic crystal filters this can be accomplished by vacuum deposition methods and for other resonators abrasive length reduction of the piezoelectric element is preferred. Because of the relatively small space between the end of the piezoelectric element and the body section, frequency adjusting using mechanical elements would be difficult or impossible. To solve this problem the present invention provides for directing a stream of abrasive particles against the piezoelectric element. There is ample room to accommodate the abrasive stream, and the abrasive stream very rapidly accomplishes first stage frequency adjusting which in most cases is sufficient.

While this is being done, it is necessary to monitor the frequency change that results from the abrasive particles. This monitoring function is advantageously carried out by providing a conductive path from a frequency adjusting apparatus through the first carrier strip, the piezoelectric element, and the second carrier strip. In order to assure that the frequency adjusting apparatus will be coupled only to the appropriate resonator, one or both of the conductive carrier strips should be interrupted so as to electrically isolate the piezoelectric elements from each other. This can be accomplished for example, by severing one of the conductive carrier strips intermediate adjacent piezoelectric elements.

Also, prior to frequency adjusting utilizing the abrasive particles, it is desirable to insert the carrier strips and the associated resonator components into a relatively rigid frame. The frame makes the overall construction more rigid and facilitates handling of the carrier strips and the associated components particularly after severing of one of the carrier strips to obtain the desired electrical isolation between piezoelectric elements. A pair of aligned openings are provided in the frame for permitting ingress and egress of the stream of abrasive particles and other openings are provided to permit the frequency adjustment apparatus to make elecrical contact with the carrier strips.

After this frequency adjusting step, the carrier strips can be removed from the frame and top and bottom covers or end walls are suitably attached to the body section to completely enclose the piezoelectric element. This can be accomplished by placing closure strips over the openings in the body sections with only one closure strip being used for a plurality of body sections.

In some instances a second frequency adjusting operation may be used. When this is desirable, one of the end walls is made, at least in part, of a member which will transmit a laser beam. This enables a second stage frequency adjusting process to be carried out by passing a laser beam through this member. One advantage of this is that it provides for very accurate tuning in that final tuning occurs after the resonator is completely packaged. After the final frequency adjusting step, the unwanted portions of the carrier strip are cut off leaving a completed batch of resonators.

The invention can best be understood by reference to the following description taken in connection with the accompanying illustrative drawings.

DESCRIPTION OF THE PREFERRED EMBODIMENTS

Figures 1, 2, 3, 3A, 4:
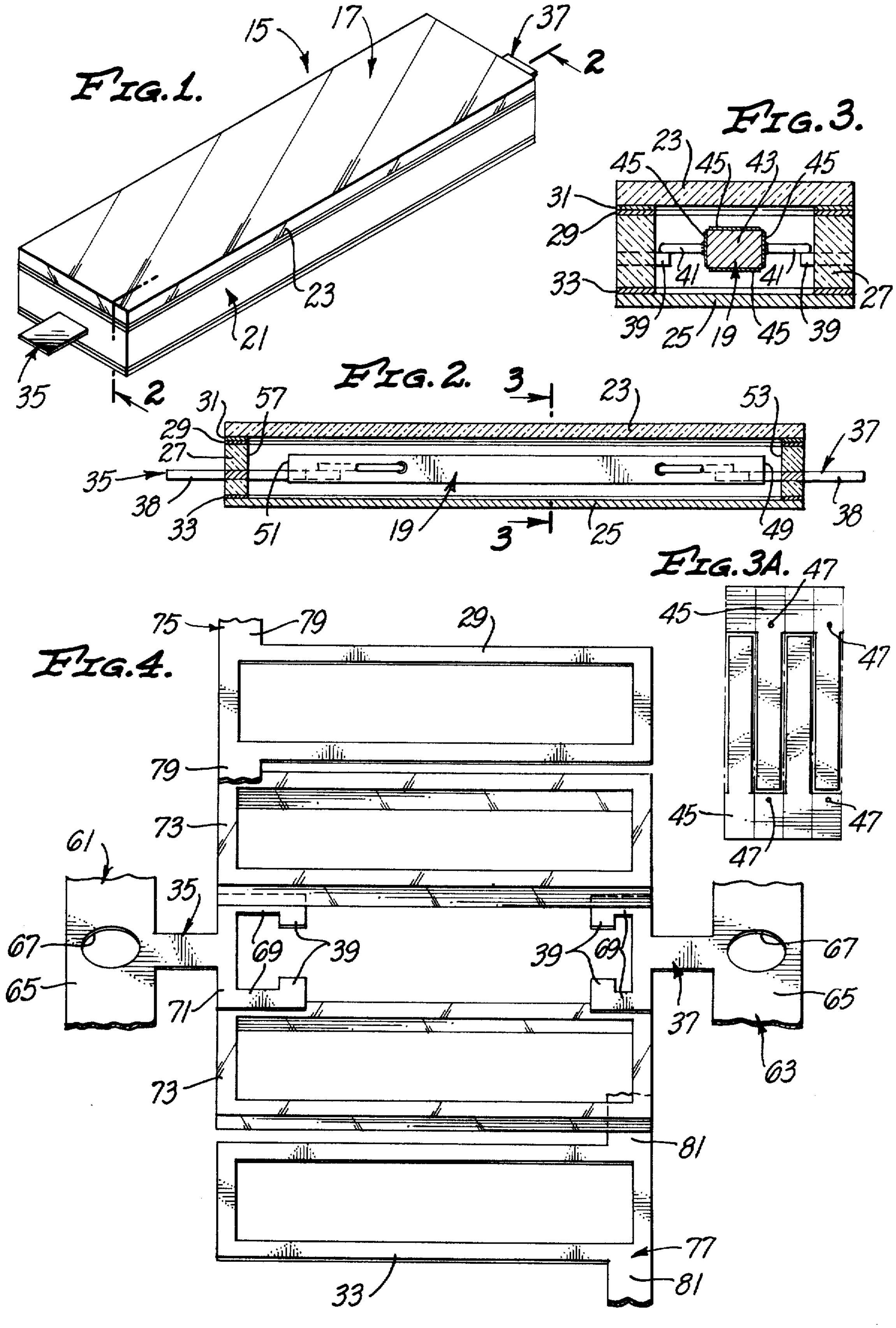
FIG. 1 is a perspective view of one form of resonator which can be constructed utilizing the process of this invention.
FIG. 2 is a sectional view taken generally along line 2—2 of FIG. 1.
FIG. 3 is an enlarged sectional view taken generally along line 3—3 of FIG. 2.
FIG. 3A is a view showing the four outer surfaces of a flexural mode piezoelectric element laid out flat to illustrate one form of electrode pattern.
FIG. 4 is a fragmentary exploded isometric view of one of the body sections and portions of two carrier strips.

FIGS. 1–3 show a piezoelectric device in the form of a resonator 15 which is illustrative of the type of resonator which can be made in accordance with the method of this invention. The resonator 15 includes a housing or enclosure 17 and a piezoelectric element or crystal plate 19.

In the embodiment illustrated, the housing 17 completely encloses the piezoelectric element 19 and includes a peripheral wall 21 and covers or end walls 23 and 25. Although the peripheral wall 23 could be constructed in different ways, in the embodiment illustrated, it includes a centrally located, relatively thick glass layer 27 and metal layers 29, 31 and 33. The peripheral wall 21 completely circumscribes the piezoelectric element 19, and in the embodiment illustrated, the peripheral wall is rectangular in plan.

The metal layers 29, 31 and 33 are preferably constructed of a material such as Kovar which can be fused to glass and the metal layers 29 and 33 are fused to the glass layer 27. The metal layer 31 is suitably joined to the metal layer 29 as by soldering or welding.

In order to permit a laser beam to be used for final frequency adjusting of the piezoelectric element 19, the end wall 23 is formed, at least in part, of a material which will transmit a laser beam. In the embodiment illustrated, the end wall 23 is constructed entirely of glass and is bonded to the metal layer 31 by a glass to metal seal. The end wall 25 can be constructed of any suitable material such as metal and may be soldered or otherwise affixed to the metal section 33.

Embedded in the glass layer 27 and forming a portion of the housing 17 are integral, substantially identical, strip-like conductors 35 and 37. One end of each of the conductors 37 terminates outside of the housing 17 to form outer terminals 38 for the resonator 15. Each of the conductors 35 and 37 has two inner ends which terminate within the housing 17 to define inner terminals 39 of the housing.

The piezoelectric element 19 is mounted on the four terminals 39 by four conductive lead wires 41 which may be suitably affixed, as by solder to the piezoelectric element and to the terminals. The lead wires 41 also electrically couple the piezoelectric element 19 to the terminals 39. Thus, a voltage may be applied to the piezoelectric element 19 by applying a potential difference to the outer terminals 38.

The piezoelectric element 19 includes a piezoelectric crystal blank 43 of quartz or similar material and a plurality of thin conductive electrodes 45 suitably affixed to the crystal blank. Of course, the number and configuration of the electrodes 45 will vary depending upon the type of resonator which it is desired to construct. FIG. 3A shows by way of example one manner in which the electrodes 45 may be applied to the piezoelectric crystal blank 43 with the points 47 illustrating the locations of the attachments of the lead wires 41 to the electrodes for flexural mode operation.

All of the surfaces of the piezoelectric element 19 are spaced from the housing 17 so that the piezoelectric element 19 may appropriately vibrate when a voltage is applied thereto. The piezoelectric element 19 has end faces 49 and 51 which are spaced from confronting end faces 53 and 57, respectively, of the peripheral wall 21. For reasons discussed hereinbelow, the spacing between the end faces 51 and 57 is greater than the spacing between the end faces 49 and 53.

FIGS. 4–13 illustrate a method which can be utilized to make many different kinds of piezoelectric devices including resonators and monolithic crystal filters. Although a specific embodiment of the method is described in FIGS. 4–13 with reference to the resonator 15, it will be apparent that the method has application to many other kinds of resonators as well as to monolithic crystal filters.

The process of this invention employs a carrier which includes a pair of elongated, identical carrier strips 61 and 63 having the conductors 35 and 37 formed integrally therewith and forming a portion thereof. The carrier strips 61 and 63 may be separate or connected together. The carrier strips 61 and 63 may be formed from thin Kovar sheet stock. Each of the carrier strips 61 and 63 includes a strip portion 65 having a plurality of accurately positioned openings 67 formed therein for use in positioning the carrier strips. The number and location of the openings 67 can be varied; however, in each of the carrier strips 61 and 63 in axial alignment with each of the piezoelectric elements 19. The conductor 35 includes arms 69 interconnected by a web 71 and having the terminals 39 formed at its opposite ends. The conductor 37 is identical except that the arms 69 are shorter for a purpose described below. The webs 71 are integrally joined to the strips 65, respectively, by attaching ears which form the terminals 38 in the finished resonator 15.

The glass layer 27 is formed from two glass sections 73 and the arms 69 and the web 71 are sandwiched between these glass sections. Metal layers 75 and 77 are placed contiguous the outer surfaces of the glass sections 73, respectively. The metal layer 75 includes a plurality of the metal sections 29 interconnected by connecting strips 79 and the metal layer 77 includes a plurality of the metal sections 33 interconnected by a plurality of connecting strips 81. In the embodiment illustrated, the connecting strips 79 are at the opposite end of the assembly from the connecting strips 81.

With the components illustrated in FIG. 4 held together as above described, they can be heated in a furnance in accordance with conventional techniques to bond or fuse all of the layers together to nearly complete the peripheral wall 21. It will be appreciated that a large number of the peripheral walls 21 may be assembled in this manner on the carrier strips 61 and 63.

Figure 5:
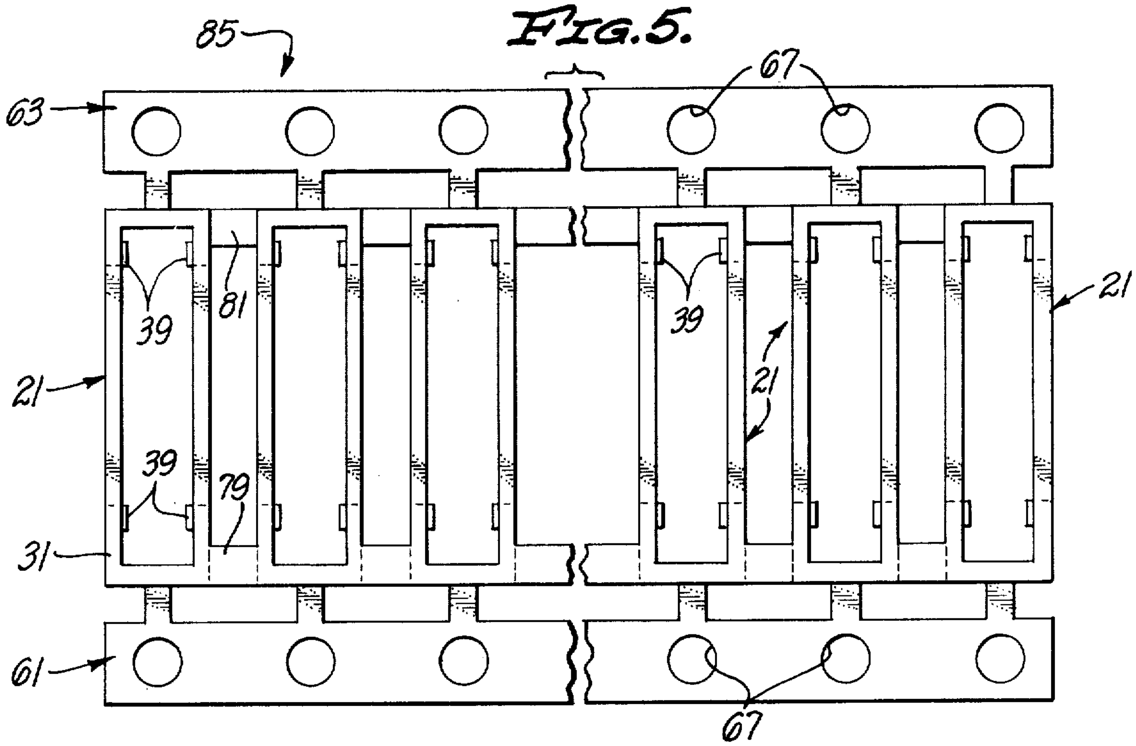
FIG. 5 is a plan view of the carrier-body section assembly.

As shown in FIG. 5, there are a plurality of the peripheral walls 21 mounted on and carried by the carrier strips 61 and 63 with each of the peripheral walls 21 being identical. This forms a carrier-body section assembly 85. In the embodiment illustrated, the peripheral walls 21 are equally spaced along the carrier strips 61 and 63. Although the carrier strips 61 and 63 have the peripheral walls mounted thereon as shown in FIG. 5, it should be understood that, in a broader sense, any suitable body section or housing section of the resonator can be carried by the carrier strips 61 and 63. In other words,, the peripheral wall 21 is merely exemplary of one housing section having terminals which may be carried by the carrier strips 61 and 63.

Figures 6, 7, 8:
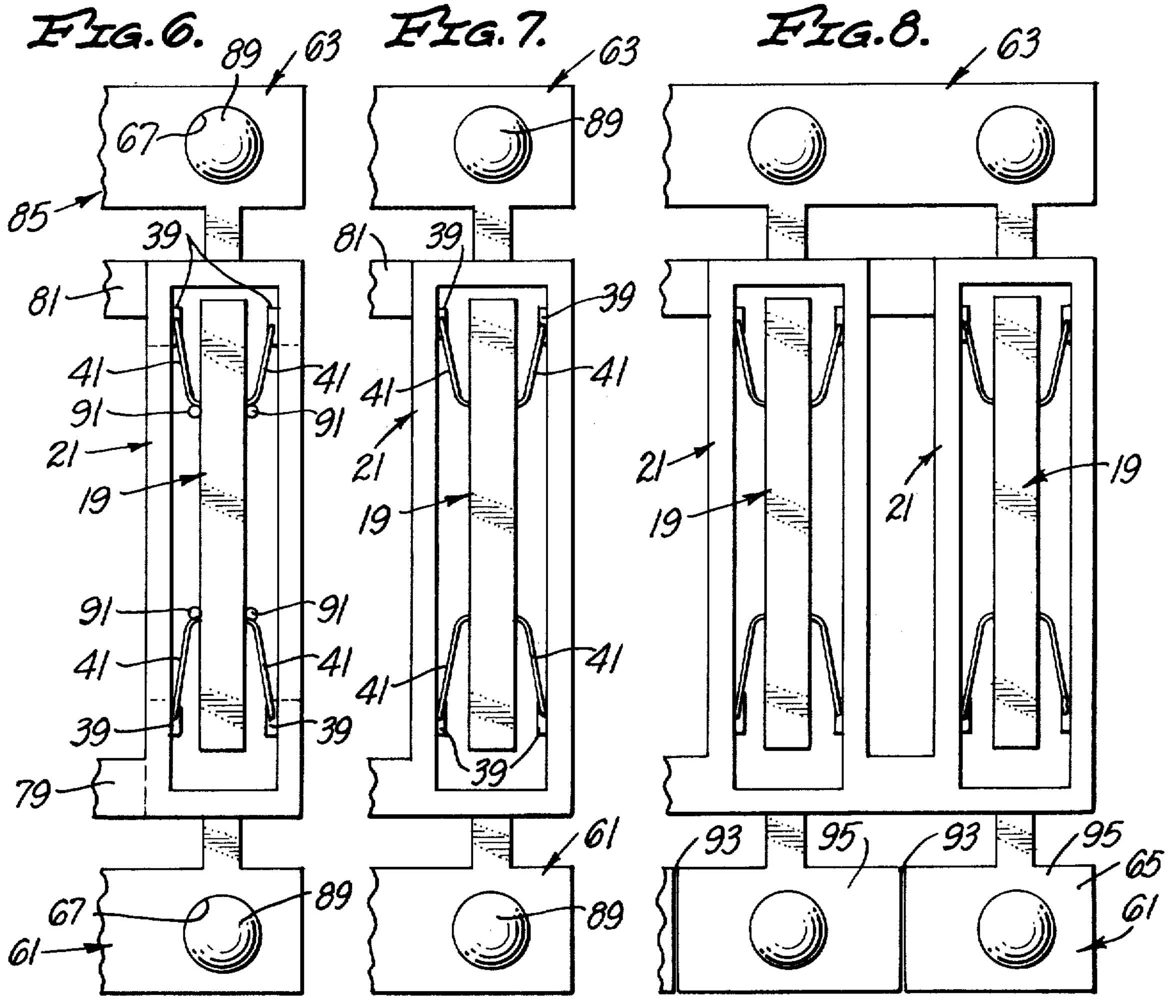
FIG. 6 is a fragmentary view of the carrier-body section assembly and a piezoelectric element at the station at which the piezoelectric element is mounted on the body section.
FIG. 7 is a plan view similar to FIG. 6 after the lead wires have been attached to the terminals of the body section.
FIG. 8 is a fragmentary plan view similar to FIG. 7 with one of the carrier strips severed to electrically isolate the piezoelectric elements from each other.

The carrier body section 85 is then transported either manually or by machine to a mounting station which is represented in FIG. 6. Locating pins 89 are suitably provided at the mounting station, and the carrier strips 61 and 63 are indexed over the mounting pins with the mounting pins projecting through the openings 67 to thereby accurately position the carrier-body section assembly 85.

A suitable fixture for locating piezoelectric elements 19 is accurately oriented at the mounting station with respect to the pins 89. The fixtures may take any form suitable for locating the piezoelectric elements 19 with respect to an associated one of the peripheral walls 21. In the embodiment illustrated, the fixture includes a set of four locator pins 91 for each of the piezoelectric elements 19. The locator pins 91 may be mounted on, and protrude upwardly from, a suitable base member (not shown).

With the carrier-body section assembly 85 mounted on the pins 89, the piezoelectric elements 19 having the lead wires 41 attached thereto are manually or otherwise positioned between the locator pins 91 as shown in FIG. 6. Specifically, the locator pins 91 engage the associated piezoelectric element 19 to locate the element along one axis, and the lead wires 41 engage the locator pins to position the piezoelectric elements 19 along a second axis. The lead wires 41 are bent prior to inserton between the locator pins 91 so that the outer ends thereof rest on the terminals 39, respectively. This locates the piezoelectric element along the third axis.

With the components positioned as shown in FIG. 6, the outer ends of the lead wires 41 can be joined in any suitable manner, such as by solder, to the associated terminals 39 to attach the piezoelectric crystal element 19 to the peripheral wall 21 as shown in FIG. 7. The soldering operation can be carried out in different ways. However, by previously coating the outer ends of the terminals 39 with solder, the entire batch of piezoelectric elements 19 may be simultaneously reflow soldered by heating the components shown in FIG. 6. This batch soldering method further reduces production time.

After the soldering step, the piezoelectric elements are stabilized by storing them at an elevated temperature for a suitable period of time to allow for stress relaxation. Then the elements 19 are prepared for frequency adjusting. This preparation includes electrically isolating the piezoelectric elements 19 from each other. This can be accomplished, for example, by severing the carrier strip 61 to form slots 93 in the strip portion 65 intermediate each adjacent pair of the piezoelectric elements 19. The slots divide the carrier strip 61 into a plurality of sections 95, one for each of the piezoelectric elements 19. Accordingly, the carrier strip 63 becomes, in effect, a common ground and each of the sections 95 becomes a contact for the associated piezoelectric element 19.

The slots 93 can be formed in any suitable manner such as by severing or blanking out narrow strips of the strip portion 65 of the carrier strip 61. The severing operation may be carried out manually or with an appropriate die or cutter which may form all of the slots simultaneously or form them in sequence as the carrier-body section is moved past the die.

Figure 9:
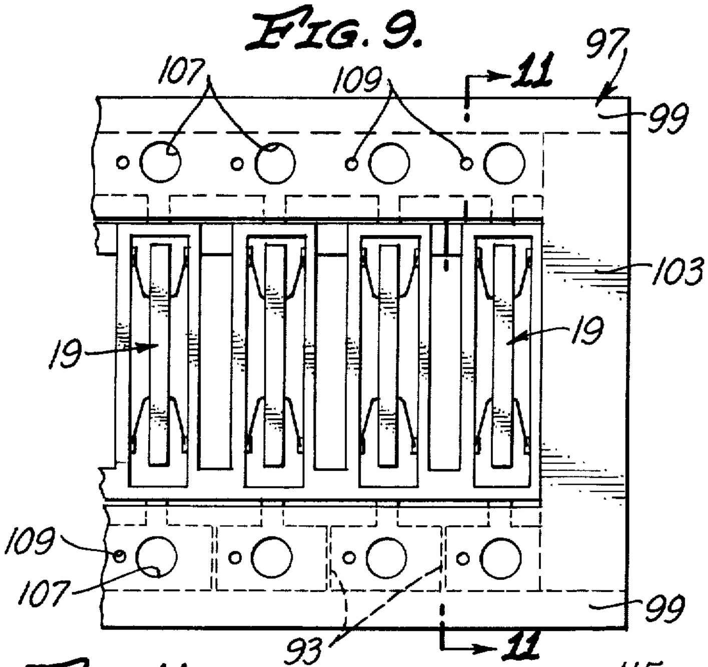
FIG. 9 is a fragmentary plan view illustrating the carrier strips and the associated resonator components inserted within a rigid housing.
Figure 10:
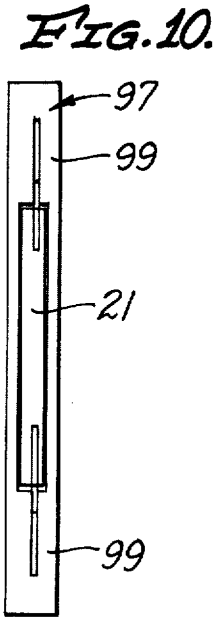
FIG. 10 is an end view of the apparatus shown in FIG. 9.

A second preparatory step to the first stage frequency adjusting is the manual or automatic insertion of the carrier-body section assembly 85 with the attached piezoelectric elements 19 into a relatively rigid frame 97 as shown in FIGS. 9 and 10. Although the carrier strips 61 and 63 themselves form a carrier, at the station illustrated in FIGS. 9 and 10, the frame 97 cooperates with the carrier strips to form the carrier for the peripheral walls 21 and the piezoelectric elements 19. The frame 97 makes the carrier-body section asembly 85 more rigid and restores some of the structural integrity lost by virtue of forming the slots 93.

Although the frame 97 may take different forms, in the embodiment illustrated it is constructed of electrical insulating material including edge members 99 having elongated, confronting grooves 101 (FIG. 11) for receiving substantial portions of the carrier strips 61 and 63, respectively. The members 99 may be connected in any suitable manner such as by cross members 103 (only one being shown in FIG. 9) at the opposite ends of the members 99. The frame 97 is open at the top and bottom to provide access to the piezoelectric elements 19.

The frame 97 has locator openings 107 arranged in longitudinally extending rows along the edge members 99 for use in accurately positioning the frame. The openings 107 preferably are in registry with the openings 67 in the carrier strips 61 and 63.

The frame 97 also has contact openings 109 arranged in longitudinally extending rows in the edge members 99. The contact openings 109 provide communication with the strip portions 65 of the carrier strips 61 and 63.

With the carrier-body section assembly 85 and the attached piezoelectric elements 19 inserted into the frame 97, the combined assembly is then placed over locator pins 111 which are mounted on a suitable base 113. This may be done manually or by machine. The locator pins 111 project through the openings 67 in the carrier strips 61 and 63 and through the openings 107 of the frame 97. This accurately positions the carrier strips 61 and 63 relative to the frame 97 and accurately positions the frame.

A frequency adjusting apparatus 115 is provided for performing the first-stage frequency adjusting operation on the piezoelectric element 19. The frequency adjusting apparatus 115 includes a nozzle 117 for directing an abrasive stream 119 against one end of the piezoelectric element 19 to reduce its length thereby increasing its frequency. The abrasive stream 27 may be comprised of a fine abrasive powder in a fluid stream such as an air stream. The stream 119 is preferably directed against the end face 51 of the piezoelectric element 19 at an acute angle.

The frequency adjusting apparatus 115 controls the rate of the length reduction of the piezoelectric element 19 and hence the rate at which the resonant frequency is increased. If this is not done, the piezoelectric element 19 may be made too short and therefore give the resonator 15 a resonant frequency which is too high for the intended purpose. The frequency adjusting apparatus 115 provides resonant frequency control by varying the rate of advance of the base 113 and hence the piezoelectric element 19 into the abrasive stream 119 and/or by varying the abrasiveness of the abrasive stream 119.

The piezoelectric element 19, the carrier-body section assembly 85, and the frame 97 are constructed and arranged for cooperation with the nozzle 117. For example, the increased spacing between the end faces 51 and 57 accommodate the abrasive stream 119. The open ended peripheral walls 21 accommodate the abrasive stream 119 and the opening in the base 113 provides a discharge path for the spent abrasive stream.

In order for the frequency adjusting apparatus 115 to control the frequency adjusting operation, the frequency adjusting apparatus monitors the resonant frequency of the piezoelectric element 19 simultaneously with frequency adjusting operation. To accomplish this, the frequency adjusting apparatus includes conductive probes 121 which can be inserted into the contact openings 109 and into electrical contact with the carrier strips 61 and 63. The probes 121 may be releasably retained in this position in any suitable manner such as by resilient plugs 123 which form a relatively tight fit with the wall of the openings 109.

With the probes 121 arranged as described above, a circuit is completed from the frequency adjusting apparatus 115 through one of the probes 121, a portion of the carrier strip 63, the associated piezoelectric element 19, a portion of the carrier strip 61, and the other probe 121. The probe 121 which engages the carrier strip 61 engages it between adjacent slots 93, i.e., on only one of the sections 95, so that a circuit is completed through only one of the piezoelectric elements 19 to the frequency adjusting apparatus 115. This enables the frequency adjusting apparatus 115 to monitor the resonant frequency of the piezoelectric element either continuously or very often so that the frequency adjusting operation can be accurately controlled. A frequency adjusting apparatus and method suitable for use in the process of this invention is disclosed in application Ser. No. 270,051 filed July 10, 1972 and naming William D. Beaver and Herbert O. Lewis as joint inventors. Frequency adjusting apparatuses of this type are also commercially available from Comtec Economation, Inc. in Santa Ana, California.

Each of the piezoelectric elements 19 may be frequency adjusted by the frequency adjusting apparatus 115 in sequence. Alternatively, several frequency adjusting apparatuses may be provided so that several piezoelectric elements 19 can be frequency adjusted simultaneously.

Figure 11:
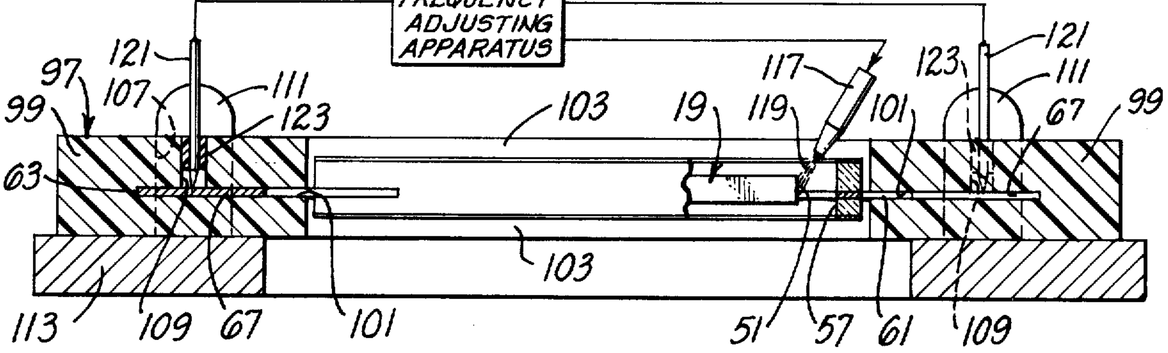
FIG. 11 is an enlarged sectional view taken generally along line 11—11 of FIG. 9 with the frequency adjusting apparatus being shown schematically and being utilized to adjust the frequency of the piezoelectric element.

After the frequency adjusting operation of FIG. 11, an elongated bottom closure strip 124 and an elongated top closure strip 125 are applied to all of the resonators 15 attached to the carrier strips 61 and 63. The closure operation is carried out with the carrier strips 61 and 63 and the associated resonators 15 within the frame 97.

In the specific embodiment illustrated, the bottom closure strip 124 is constructed of metal and includes a plurality of the end walls 25 interconnected by connecting strips 126 with one of the end walls 25 being provided for each of the resonators. The top closure strip 125 includes a plurality of the metal sections 31 with each of the metal sections 31 having one of the glass end walls 23 bonded thereto by a suitable glass to metal seal. One of the glass end walls 23 and the metal sections 31 is provided for each of the resonators. The closure strip 125 includes integral connecting strips 127 on the metal sections 31 for interconnecting adjacent metal sections 31.

Figures 12, 12A, 14, 15, 16:
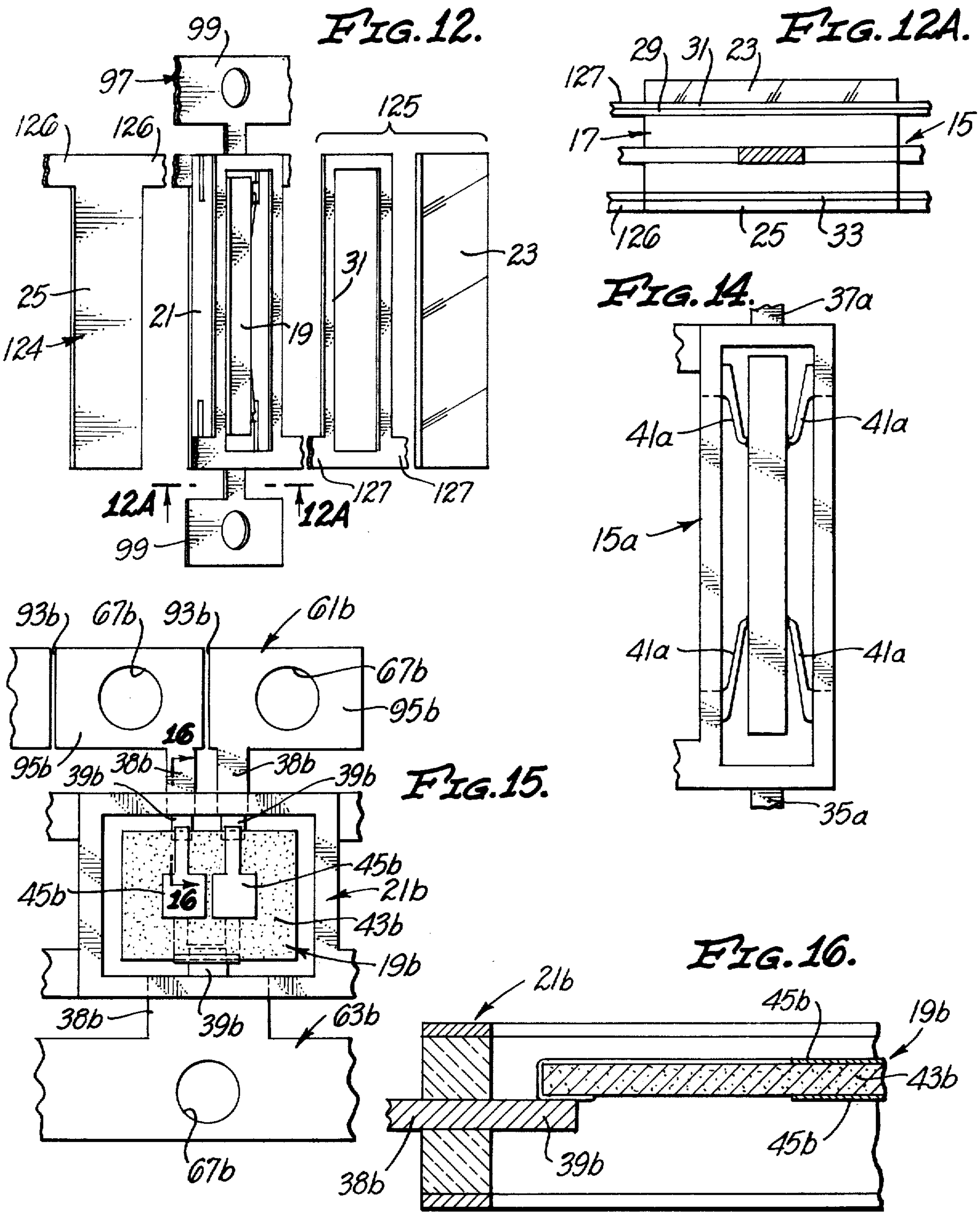
FIG. 12 is a fragmentary exploded isometric view illustrating how the end walls or covers are applied to the body sections.
FIG. 12A is an end elevational view of one of the resonators after the covers have been applied thereto.
FIG. 14 is a fragmentary plan view similar to FIG. 6 showing how the method of this invention can be applied to a resonator in which the lead wires are formed integrally with the carrier strips.
FIG. 15 is a fragmentary top plan view similar to FIG. 8 illustrating how the method of this invention can be applied to another type of piezoelectric device such as a monolithic crystal filter.
FIG. 16 is a sectional view taken generally along line 16—16 of FIG. 15.

The closure strips 124 and 125 are placed below and above the resonators, respectively, and the entire assembly is heated to reflow solder the end walls 25 to the metal sections 33 and the metal sections 31 to the metal sections 29 to form a plurality of the housings 17 as shown in FIG. 12A. Of course, the housing 17 may be sealed utilizing other techniques, if desired.

Next, with the resonators 15 carried by the frame 97, each of the resonators 15 may be subjected to a second stage of final frequency adjusting operation. This step is optional and may be eliminated if the first stage frequency adjusting operation provides the resonator with sufficiently precise frequency characteristics. This is carried out utilizing a laser 129 which may be a pulsed laser. The laser 129 directs a laser beam B1 through the glass end wall 23 and against one of the electrodes 45 of the piezoelectric element 19. The electrode 45 is typically formed of thin metal such as gold and the laser beam removes or displaces small quantities of the electrode 45 and this brings about slight increases in the resonant frequency of the resonator 15.

The final frequency adjusting operation can be carried out in different ways. In the embodiment illustrated, the frame 97 is positioned on locator pins 133 which are mounted on a suitable base 135. The locator pins 133 project through the openings 107 in much the same manner described above with reference to the first stage frequency adjusting operation shown in FIG. 11. In this manner, the resonators 15 can be accurately located with respect to the laser 129.

The laser 129 forms a portion of a frequency adjusting apparatus 137. The frequency adjusting apparatus moves the base 135 and hence the resonators 15 relative to the laser 129 to thereby allow the laser beam 131 to remove some of the metal of the electrode 45 along a prescribed path. While the base 135 and the resonators 15 are being moved relative to the laser beam 131 to change the frequency of one of the resonators, the frequency adjusting apparatus 137 simultaneously monitors the frequency change resulting from the action of the laser beam 131 on the electrode 45 in much the same manner described above with reference to FIG. 11. Specifically, conductive probes 139 are inserted through the contact openings 109 and into engagement with the carrier strips 61 and 63 to thereby complete a circuit through the resonator 15, the frequency of which is being adjusted. When the resonator 15 reaches the desired frequency, the laser beam 31 is deflected or suitably altered so that it will not further affect the frequency of the resonator 15. The base 135 is then indexed to bring the next resonator 15 into alignment with the laser 129 and the operation described above is repeated. It will be appreciated that this indexing motion may be carried out automatically utilizing, for example, an X-Y table or manually. The frequency monitoring function for the second stage frequency adjusting operation can be accomplished in the same manner as with the frequency adjusting apparatus 115 except that the controls are simpler in that the laser beam 131 is simply prevented from having further effect on the frequency of the resonator when that resonator reaches the desired frequency. Of course, other known techniques for frequency monitoring can be employed.

After the second stage frequency adjusting step, the resonators 15 and the carrier 61 and 63 are removed from the frame 97 and the excess metal portions of the carrier strips 61 and 63 are sheared off to leave the conductors 35 and 37 as the only portions of the carrier strips ultimately embodied in the resonators 15. After the shearing steps, each of the resonators 15 appears as shown in FIGS. 1–3. The resonators 15 are then ready for utilization in any one of a variety of devices such as watches.

FIG. 14 shows, by way of example, a second form of resonator which can be constructed in accordance with the method of this invention. The resonator **15*a* is identical to the resonator 15 in every respect except that the elongated leads 41*a* are formed integrally with the conductors 35*a* and 37*a* and the carrier strips. By forming the leads 41*a* integrally with the conductors 35*a* and 37*a*, the various lead wire preparation and bonding steps can be eliminated. The leads 41*a*** can be formed utilizing any suitable procedure such as a chemical milling operation in order to make them of the necessary size and shape.

With regard to the method, the resonator **15*a* can be made in the same manner described above with reference to FIGS. 4–13 except that a suitable fixture for locating the piezoelectric element 19*a* must be provided. In addition, the soldering step shown in FIG. 7 would be modified in making the resonator 15*a* so as to solder the leads 41*a* to the electrodes of the piezoelectric element 19*a***.

The method of this invention is equally applicable to making monolithic crystal filters. FIGS. 15 and 16 illustrate how the method of this invention can be applied to making one form of monolithic crystal filter **15*b*. Except to the extent noted herein, it may be assumed that the method of making the monolithic crystal filter 15*b* is substantially identical to the method of making the resonator 15 as described with reference to FIGS. 4–13. Elements shown in FIGS. 15 and 16 corresponding to elements shown in FIGS. 1–13** are designated by corresponding reference numerals followed by the letter *b*.

FIGS. 15 and 16 show a two-pole monolithic crystal filter **15*b* in the same stage of completion as the resonator 15 in FIG. 8. Specifically, the filter 15*b* includes a peripheral wall 21*b* which, except for dimensional variations and the location of terminals 39*b*, may be identical to the peripheral wall 21 shown in FIG. 8. In the embodiment illustrated, three of the terminals 39*b*** are provided.

The filter **15*b* also includes a piezoelectric element 19*b* which in turn comprises a piezoelectric crystal blank and two upper electrodes 45*b* and one lower electrode 45*b*. The lower electrode 45*b* includes two interconnected electrode sections which are substantially identical to the two upper electrodes 45*b*, respectively. Except for dimensional variations and for the configuration of the electrodes 45*b*, the piezoelectric element 19*b* may be identical to the piezoelectric element 19**.

One of the terminals **39*b* is connected to the lower electrode 45*b* and two of the electrodes 39*b* are coupled to the two upper electrodes 45*b*. As shown in FIG. 16, the piezoelectric element 19*b* is soldered to and is supported by the terminals 39*b***.

The filters **15*b* are carried by carrier strips 61*b* and 63*b* which have the terminals 39*b* formed integrally therewith. The configuration of the carrier strips 61*b* and 63*b* and the location of the openings 67*b* differ from the carrier strips 61 and 63. However, the carrier strips 61b and 63b serve the same purposes and functions as the carrier strips 61 and 63. It is also necessary to form a slot 93b between each pair of the electrodes 45b on the upper surface of the piezoelectric element 19b as well as one of the slots 93b between each adjacent pair of monolithic crystal filters 15b. This is necessary in order to appropriately electrically isolate sections of the piezoelectric element 19** from each other.

With respect to the method of making the filter 15b, carrier body sections which comprise the carrier strips 61b and 63b and a plurality of the peripheral walls 21b are provided in the same manner as discussed hereinabove with reference to FIG. 5. Piezoelectric elements 19b are then positioned within each of the peripheral walls 21b utilizing an appropriate fixture (not shown) and a bonding step as discussed above with reference to FIG. 7 is performed to simultaneously affix, as by reflow soldering, each of the piezoelectric elements 19b to its associated terminals 39b. Next, the carrier strip 61b is appropriately interrupted to form the slots 93b as shown in FIG. 15. The construction shown in FIGS. 15 and 16 is then inserted into a frame as discussed in connection with, and as shown in, FIGS. 9 and 10.

Figure 17:
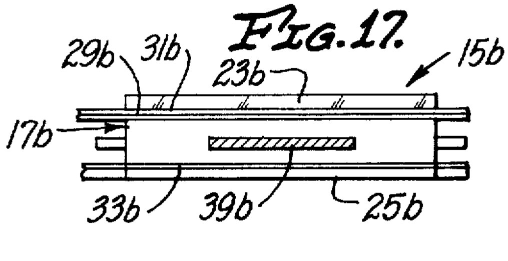
FIG. 17 is an end elevational view of one of the monolithic crystal filters after the covers have been applied thereto.

One difference in the method of making the monolithic crystal filters 15b is that the first stage frequency adjusting operation may be carried out, for example, utilizing known vacuum deposition methods. Frequency adjusting utilizing vacuum deposition is known in the art and includes adding very minor quantities of metal to the electrodes 45b to reduce the resonant frequency of the piezoelectric element 19b. Following this, the peripheral walls 21b are enclosed utilizing closure strips as described above in connection with FIGS. 12 and 12A. This forms a housing 17b as shown in FIG. 17.

Figure 13:
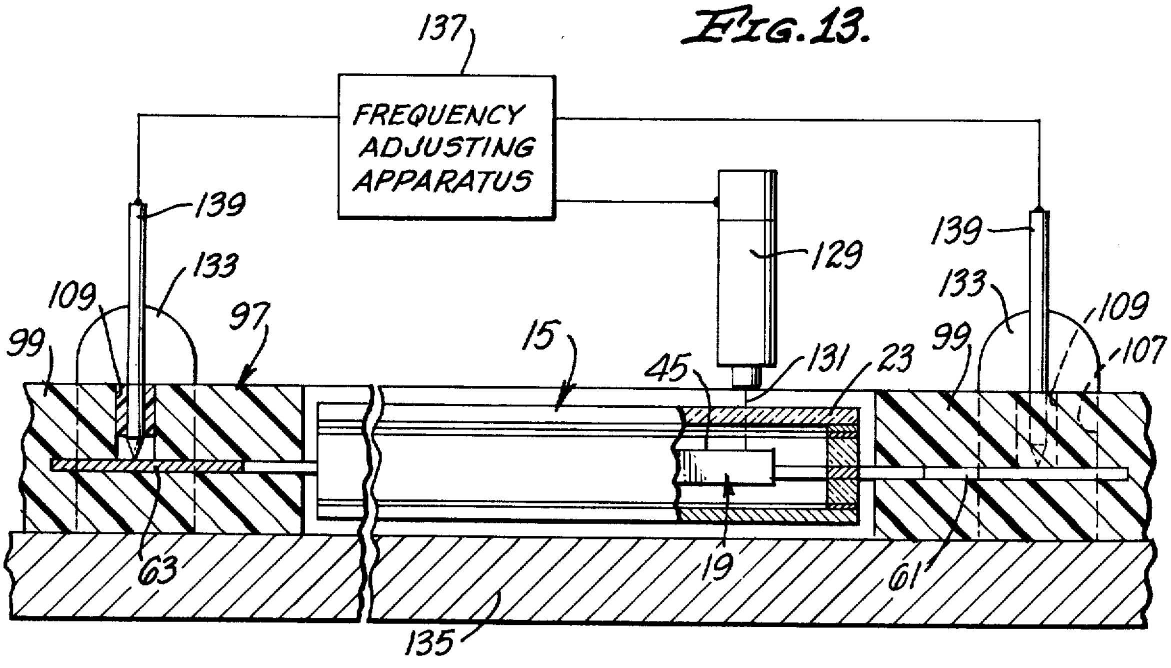
FIG. 13 is a fragmentary view partially in section and partially diagrammatic illustrating the frequency adjusting step utilizing the laser beam.

Next, a second stage frequency adjusting operation may be carried out, if desired, much in the same manner as described in connection with FIG. 13. The laser beam is used to change the interresonant coupling between the electrodes 45b by removing some of the metal of the electrodes along their edges and to frequency adjust the filter 15b by removing material from the central portions of the electrodes. Except for directing the laser beam through the glass layer 27b of the filter 15b and the use of a frame to support the filters during this process, the use of the laser for adjusting the frequency and the interresonant coupling may be in accordance with known techniques.

Finally, the filters 15b and the carrier strips 61b and 63b are removed from the associated frame and appropriately trimmed to remove the excess metal portions of the carrier strips 61 and 63. This leaves the external terminals 38b as the only portions of the carrier strips 61b and 63b protruding from the peripheral wall 21b. Thus, except for the frequency adjusting operations, the process steps for making the monolithic crystal filter 15b are substantially identical to the process steps for making the resonator 15.

Although an exemplary embodiment of this invention has been shown and described, many changes, modifications and substitutions may be made by one with ordinary skill in the art without necessarily departing from the spirit and scope of this invention.

We claim:

1. A method of making piezoelectric devices comprising:

providing a carrier-body section assembly including a carrier and a plurality of body sections attached to said carrier whereby the body sections can be carried as a unit by said carrier and with each of said body sections including a set of terminals;

providing a plurality of piezoelectric elements each of which includes a piezoelectric crystal blank;

attaching one of said piezoelectric elements to each of said body sections with the set of terminals of each of said body sections being electrically coupled to the associated piezoelectric element;

adjusting the frequency of the piezoelectric elements subsequent to said step of attaching;

removing the body sections with the attached piezoelectric elements from said carrier subsequent to at least a portion of said step of frequency adjusting to thereby provide a plurality of the piezoelectric devices;

said carrier including a conductive carrier strip and interrupting said conductive carrier strip intermediate adjacent piezoelectric elements prior to adjusting the frequency and retaining the body sections together as a unit subsequent to said step of interrupting.

2. A method as defined in claim 1 wherein at least one of the body sections has an opening therein, said method including closing said opening at least in part with a member which is capable of passng a laser beam and said step of frequency adjusting includes directing a laser beam through said member and against the piezoelectric element associated with said one body section.

3. A method of making devices comprising:

providing a carrier-body section assembly including a carrier and a plurality of body sections attached to said carrier whereby the body sections can be carried as a unit by said carrier and with each of said body sections including a set of terminals;

providing a plurality of piezoelectric elements each of which includes a piezoelectric crystal blank;

attaching one of said piezoelectric elements to each of said body sections with the set of terminals of each of said body sections being electrically coupled to the associated piezoelectric element;

adjusting the frequency of the piezoelectric elements subsequent to said step of attaching;

removing the body sections with the attached piezoelectric elements from said carrier subsequent to at least a portion of said step of frequency adjusting to thereby provide a plurality of the piezoelectric devices; and said step of providing including providing at least one carrier strip having a plurality of terminals and attaching a plurality of body sections to said carrier strip with at least one of said terminals being associated with each of said body sections whereby the carrier strip forms portions of said body sections.

4. A method as defined in claim 3 including severing said conductive carrier strip to electrically isolate the piezoelectric elements from each other prior to frequency adjusting and retaining the body sections together as a unit subsequent to said step of severing, said step of frequency adjusting including directing a stream of abrasive particles against the piezoelectric elements, at least one of the body sections having an opening therein, said method including closing said opening with a member which will pass a laser beam and said step of frequency adjusting including directing a laser beam through said member and against the piezoelectric element associated with said one body section.

5. A method of making piezoelectric devices comprising:

providing a carrier-body section assembly including a carrier and a plurality of body sections attached to said carrier whereby the body sections can be carried as a unit by said carrier and with each of said body sections including a set of terminals;

providing a plurality of piezoelectric elements each of which includes a piezoelectric crystal blank;

attaching one of said piezoelectric elements to each of said body sections with the set of terminals of each of said body sections being electrically coupled to the associated piezoelectric element;

adjusting the frequency of the piezoelectric elements subsequent to said step of attaching;

removing the body sections with the attached piezoelectric elements from said carrier subsequent to at least a portion of said step of frequency adjusting to thereby provide a plurality of the piezoelectric devices;

one end of one of said piezoelectric elements being spaced from the associated body section; and said step of frequency adjusting including directing a stream of abrasive particles against said one piezoelectric element adjacent said one end thereof.

6. A method as defined in claim 5 wherein said step of frequency adjusting is carried out with the piezoelectric elements being substantially electrically isolated from each other.

7. A method as defined in claim 5 including placing said carrier-body section assembly in a relatively rigid frame prior to frequency adjusting to make the carrier-body section assembly more rigid.

8. A method as defined in claim 5 wherein a plurality of said body sections has openings therein and including closing said openings by placing a closure strip over said openings, affixing said closure strip to said plurality of body sections, and interrupting said closure strip intermediate said body sections.

9. A method of making piezoelectric devices comprising:

providing a carrier-body section assembly including at least one carrier strip having a plurality of terminals and a plurality of body sections attached to said carrier strip with at least two of said terminals forming a portion of each of said body sections;

providing a plurality of piezoelectric elements each of which includes a piezoelectric crystal blank;

attaching one of said piezoelectric elements to the terminals of each of said body sections with the terminals of said body sections supporting and being electrically coupled to the associated piezoelectric elements and with the piezoelectric elements being suspended from the associated terminals to permit vibration thereof free of interference from the associated body section; and removing said body sections with the attached piezoelectric elements from the carrier strip.

10. A method as defined in claim 9 wherein said carrier strip is a first carrier strip and said step of providing includes providing a second carrier strip spaced from said first carrier strip, said body sections lying in the space between said carrier strips, each of said carrier strips having attaching ears attached to and forming portions of the body sections and defining said terminals.

11. A method as defined in claim 10 including adjusting the frequency of the piezoelectric elements, a plurality of said body sections having an opening, placing a closure strip over said openings, affixing the closure strip to said plurality of body sections to close said openings, and separating the closure strip between body sections subsequent to said step of placing.

12. A method as defined in claim 9 wherein said carrier-body section assembly includes at least one elongated lead formed integrally with the carrier strip and extending inwardly of the associated body section to terminate in a first of said terminals and said step of attaching includes attaching the associated piezoelectric element to said first terminal.

13. A method of making piezoelectric devices comprising:

providing a carrier-body section assembly including first and second spaced, conductive, carrier strips and a plurality of body sections positioned between and attached to the carrier strips whereby the body sections can be carried by the carrier strips, each of said body sections having at least first and second terminals;

providing a plurality of piezoelectric elements each of which includes a piezoelectric crystal blank;

attaching one of said piezoelectric elements to each of said body sections with the terminals of each of said body sections being electrically coupled to the associated piezoelectric element;

interrupting at least one of said carrier strips to permit current to be passed through one of the piezoelectric elements without passing through the other of said piezoelectric elements;

adjusting the frequency of the piezoelectric elements by directing a stream of abrasive against each of the piezoelectric elements;

forming an enclosure around each of said piezoelectric elements with the associated body section forming a portion of the enclosure and with at least a portion of said enclosure being capable of transmitting a laser beam;

adjusting the frequency of the piezoelectric elements by directing a laser beam through said portions of said enclosures; and removing said enclosures from the carrier strip.

14. A method as defined in claim 13 wherein the first mentioned step of adjusting the frequency includes establishing a conductive path from a frequency adjusting apparatus through the first carrier strip, the first terminal, the piezoelectric element, the second terminal and the second carrier strip and monitoring the change in frequency resulting from the abrasive stream utilizing said conductive path.

15. A method as defined in claim 13 wherein each of said body sections is in the form of an open ended peripheral wall and the first mentioned step of frequency adjusting is carried out by directing the abrasive stream through the open end of the body section and into contact with the associated piezoelectric element.

16. A method as defined in claim 13 including inserting said carrier-body section assembly into a rigid housing and carrying out the first mentioned step of adjusting the frequency with the carrier-body section assembly in said housing.

* * * * *